United States Patent
Wang et al.

(10) Patent No.: US 11,211,442 B2
(45) Date of Patent: Dec. 28, 2021

(54) ARRAY SUBSTRATE, WITH SHIELDING LAYER, METHOD FOR FABRICATING ARRAY SUBSTRATE WITH SHIELDING LAYER, DISPLAY PANEL, AND DISPLAY DEVICE

(71) Applicant: BOE TECHNOLOGY GROUP CO., LTD., Beijing (CN)

(72) Inventors: Can Wang, Beijing (CN); Can Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 615 days.

(21) Appl. No.: 16/087,002

(22) PCT Filed: Jan. 24, 2018

(86) PCT No.: PCT/CN2018/073990
§ 371 (c)(1),
(2) Date: Sep. 20, 2018

(87) PCT Pub. No.: WO2019/010953
PCT Pub. Date: Jan. 17, 2019

(65) Prior Publication Data
US 2021/0202644 A1 Jul. 1, 2021

(30) Foreign Application Priority Data
Jul. 13, 2017 (CN) .......................... 201710570694.6

(51) Int. Cl.
*H01L 29/08* (2006.01)
*H01L 27/32* (2006.01)

(52) U.S. Cl.
CPC ...... *H01L 27/3272* (2013.01); *H01L 27/3265* (2013.01); *H01L 2227/323* (2013.01)

(58) Field of Classification Search
CPC ............ H01L 27/3272; H01L 27/3265; H01L 2227/323
See application file for complete search history.

(56) References Cited

U.S. PATENT DOCUMENTS

2016/0320650 A1 11/2016 Ding et al.
2016/0365532 A1* 12/2016 Song ....................... H01L 51/56
(Continued)

FOREIGN PATENT DOCUMENTS

CN 101266996 A 9/2008
CN 101569013 A 10/2009
(Continued)

OTHER PUBLICATIONS

PCT International Search Report, Application No. PCT/CN2018/073990, dated May 2, 2018, 8 pages: with English translation.
(Continued)

*Primary Examiner* — Phuc T Dang
(74) *Attorney, Agent, or Firm* — Armstrong Teasdale LLP (57) ABSTRACT

The present disclosure provides an array substrate, a method for fabricating the array substrate, a display panel, and a display device, wherein there is disposed a shielding layer insulated from each of anodes and capable of shielding an electric field between two adjacent pixels, so that when a pixel emits light, an electric field between an anode in the pixel emitting light and an anode in an adjacent pixel can be shielded. Thus, it is possible to avoid a coupling voltage at the anode in the adjacent pixel caused by the anode in the pixel emitting light under the coupling effect, thereby eliminating the interference with the pixel light emission from the coupling effect between the anodes in the two adjacent pixels, and improving the display effect.

19 Claims, 5 Drawing Sheets (56) References Cited

U.S. PATENT DOCUMENTS

2017/0062541 A1* 3/2017 Ishiyama ............ H01L 27/3272
2018/0366672 A1* 12/2018 Wang ...................... H01L 51/56

FOREIGN PATENT DOCUMENTS

| CN | 103676375 A | 3/2014 |
| CN | 104597670 A | 5/2015 |
| CN | 106773394 A | 5/2017 |
| CN | 107369700 A | 11/2017 |

OTHER PUBLICATIONS

PCT Written Opinion, Application No. PCT/CN2018/073990, dated May 2, 2018, 6 pages.: with English translation of relevant part.
China First Office Action, Application No. 201710570694.6, dated Jun. 29, 2018, 20 pps.: with English translation.

* cited by examiner

Forming, on a base substrate, a shielding layer and an anode located in each of pixels and insulated from the shielding layer; wherein the shielding layer shields an electric field between two adjacent pixels ~ 301

ARRAY SUBSTRATE, WITH SHIELDING LAYER, METHOD FOR FABRICATING ARRAY SUBSTRATE WITH SHIELDING LAYER, DISPLAY PANEL, AND DISPLAY DEVICE

CROSS REFERENCE TO RELATED APPLICATIONS

This patent application is a National Stage Entry of PCT/CN2018/073990 filed on Jan. 24, 2018, which claims the benefit and priority of Chinese Patent Application No. 201710570694.6 filed on Jul. 13, 2017, the disclosures of which are incorporated herein by reference in their entirety as part of the present application.

BACKGROUND

The present disclosure relates to the field of display techniques, and particularly, to an array substrate, a method for fabricating array substrate, a display panel and a display device.

With the advantages such as active illumination, wide viewing angle, light weight, small thickness, fast response, high dynamic picture quality, wide temperature range and flexible display, the Organic Light Emitting Diode (OLED) display attracts extensive attentions and has been applied in the display fields such as mobile phones, tablet computers, and digital cameras. Generally, the OLED includes an anode, a light emitting layer, and a cathode which are arranged in a stack.

BRIEF DESCRIPTION

The embodiments of the present disclosure provide an array substrate, a method for fabricating array substrate, a display panel and a display device.

A first aspect of the present disclosure provides an array substrate, including a substrate and a plurality of pixels located on a side of the substrate, each of the pixels includes an anode, the array substrate further includes a shielding layer disposed to be insulated from each of the anodes, the shielding layer is used to shield an electric field between two adjacent pixels.

According to one embodiment of the present disclosure, an orthographic projection of the shielding layer on the substrate at least partially overlaps an orthographic projection of a gap between the respective adjacent pixels on the substrate.

According to one embodiment of the present disclosure, the shielding layer is located on a side of each of the anodes facing the substrate.

According to one embodiment of the present disclosure, the shielding layer is disposed in the same layer as each of the anodes and located at a gap between the respective pixels.

According to one embodiment of the present disclosure, the shielding layer has a first portion and a second portion, wherein the first portion is located on a side of each of the anodes facing the substrate, and a second portion is disposed in the same layer as each of the anodes and located at a gap between the respective pixels.

According to one embodiment of the present disclosure, a material of the shielding layer includes a conductive material, and the shielding layer is grounded.

According to one embodiment of the present disclosure, an orthographic projection of the gap between the adjacent pixels on the substrate is within the orthographic projection of the shielding layer on the substrate, there is a first coupling capacitor between the shielding layer and each of the anodes, and there is a second coupling capacitor between two adjacent anodes, a capacitance value of the first coupling capacitor corresponding to each of the anodes is not less than a capacitance value of corresponding second coupling capacitor.

According to one embodiment of the present disclosure, wherein, as for the anode, a facing area between the shielding layer and an edge of the anode in a direction perpendicular to the substrate is equal to a facing area between the anode and an adjacent anode, and a distance between the shielding layer and the anode is not larger than a distance between the anode and the adjacent anode.

According to one embodiment of the present disclosure, wherein, as for the anode, a distance between the shielding layer and the anode is equal to a distance between the anode and an adjacent anode, and a facing area between the shielding layer and an edge of the anode in a direction perpendicular to the substrate is not less than a facing area between the anode and the adjacent anode.

According to one embodiment of the present disclosure, the array substrate further includes a top electrode located in each of the pixels on a side of the shielding layer facing the substrate, a first insulation layer located between the top electrode and the shielding layer, and a second insulation layer located between the shielding layer and each of the anodes, each of the anodes is electrically connected to corresponding top electrode through a first via running through the first insulation layer and the second insulation layer, wherein an orthographic projection of each of the first vias on the substrate is within an orthographic projection of corresponding top electrode on the substrate, and does not overlap the orthographic projection of the shielding layer on the substrate.

According to one embodiment of the present disclosure, the shielding layer is disposed in the same thickness as each of the anodes.

According to one embodiment of the present disclosure, the array substrate further includes a top electrode located in each of the pixels on a side of the shielding layer facing the substrate, and a third insulation layer located between the shielding layer and the top electrode, each of the anodes is electrically connected to corresponding top electrode through a second via running through the third insulation layer, wherein an orthographic projection of each of the second vias on the substrate is within an orthographic projection of corresponding top electrode on the substrate, and does not overlap the orthographic projection of the shielding layer on the substrate.

According to one embodiment of the present disclosure, the conductive material includes a metallic material.

A second aspect of the present disclosure provides a display panel, including any of the array substrates provided by the embodiment of the present disclosure.

A third aspect of the present disclosure provides a display device, including the display panel provided by the embodiments of the present disclosure.

A fourth aspect of the present disclosure provides a method for fabricating any of the array substrates provided by the embodiment of the present disclosure, including forming, on a substrate, a shielding layer and an anode located in each of the pixels and insulated from the shielding layer, wherein the shielding layer shields an electric field between two adjacent pixels.

According to one embodiment of the present disclosure, before forming, on a substrate, a shielding layer and an anode located in each of the pixels and insulated from the shielding layer, the method further includes forming a top electrode located in each of the pixels on the substrate, forming a first insulation layer on the substrate where the top electrode is formed, wherein forming a shielding layer specifically includes forming a shielding layer on the substrate where the first insulation layer is formed, after forming a shielding layer and before forming an anode located in each of the pixels and insulated from the shielding layer, the method further includes forming, on the substrate where the shielding layer is formed, a second insulation layer and first vias running through the first insulation layer and the second insulation layer, wherein an orthographic projection of each of the first vias on the substrate is within an orthographic projection of corresponding top electrode on the substrate, and does not overlap an orthographic projection of the shielding layer on the substrate, forming an anode located in each of the pixels and insulated from the shielding layer includes forming an anode in each of the pixels of the substrate where the first vias are formed, so that the anode is electrically connected to corresponding top electrode through corresponding first via.

According to one embodiment of the present disclosure, before forming, on a substrate, a shielding layer and an anode located in each of the pixels and insulated from the shielding layer, the method further includes forming a top electrode located in each of the pixels on the substrate, forming, on the substrate where the top electrode is formed, a third insulation layer and second vias running through the third insulation layer and located in each of the pixels, wherein an orthographic projection of each of the second vias on the substrate is within an orthographic projection of corresponding top electrode on the substrate, forming, on a substrate, a shielding layer and an anode located in each of the pixels and insulated from the shielding layer specifically includes forming, on the substrate where the third insulation layer is formed, a shielding layer and an anode located in each of the pixels and insulated from the shielding layer, so that each of the anodes is electrically connected to corresponding top electrode through corresponding second vias, wherein an orthographic projection of each of the second vias on the substrate does not overlap an orthographic projection of the shielding layer on the substrate.

According to one embodiment of the present disclosure, a material of the formed shielding layer includes a conductive material, and the formed shielding layer is grounded.

DETAILED DESCRIPTION

In order that the technical solutions and advantages of the present disclosure are much clearer, the implementations of the array substrate, the method for fabricating the array substrate, the display panel and the display device provided by the embodiments of the present disclosure will be described in detail as follows with reference to the drawings. It should be understood that the embodiments described below are just used to describe and explain, rather than limiting the present disclosure. Moreover, in the case of no conflict, the embodiments in the present application and the features in the embodiments can be combined with each other.

The flowchart depicted in the present disclosure is merely an example. There may be many modifications to the flowchart or the steps described therein without deviating from the spirit of the present disclosure. For example, the steps may be performed in a different order, or some steps may be added, deleted, or amended. These modifications are all deemed as parts of the claimed aspects.

In the description of the present disclosure, the orientations or position relationship indicated by the terms "on", "above", "under", "below", "between", etc. are those illustrated based on the orientation or position relationship shown in the drawings. They are just used to facilitate and simplify the description of the present disclosure, rather than indicating or implying that any mentioned device or element must have a particular orientation, or be constructed or operated in a particular orientation, and hence cannot be understood as limitations to the present disclosure. In addition, when an element or layer is referred to as being "on" another element or layer, it may be directly located on the another element or layer, or there may be an intermediate element or layer; similarly, when an element or layer is referred to as being "under" another element or layer, it may be directly located under the another element or layer, or there may be at least one intermediate element or layer; and when an element or layer is referred to as being "between" two elements or layers, it may be an only element or layer between the two elements or layers, or there may be more than one intermediate element or layer.

The thickness, size, and shape of each layer of thin film in the drawings do not reflect the true scale of the array substrate, and the purpose is only to schematically illustrate the content of the present disclosure.

The OLED generally includes an anode, a light emitting layer, and a cathode which are arranged in a stack. The anode in each of the pixels of an OLED display generally has a certain thickness, which causing the anodes in two adjacent pixels to have a coupling capacitor between their opposing faces perpendicular to the OLED display. When one pixel emits light, the anode in the pixel will have a certain voltage, and due to the small distance between the two adjacent pixels and the coupling effect, the anode in the adjacent pixel will have a coupling voltage, which interferes with the light emission of other pixels and degrades the display effect. Especially in a small-sized or micro-sized high-resolution OLED display, the distance between the adjacent pixels is much smaller, and the phenomenon of the interference with the light emission of other pixels is more obvious.

Figure 1A:
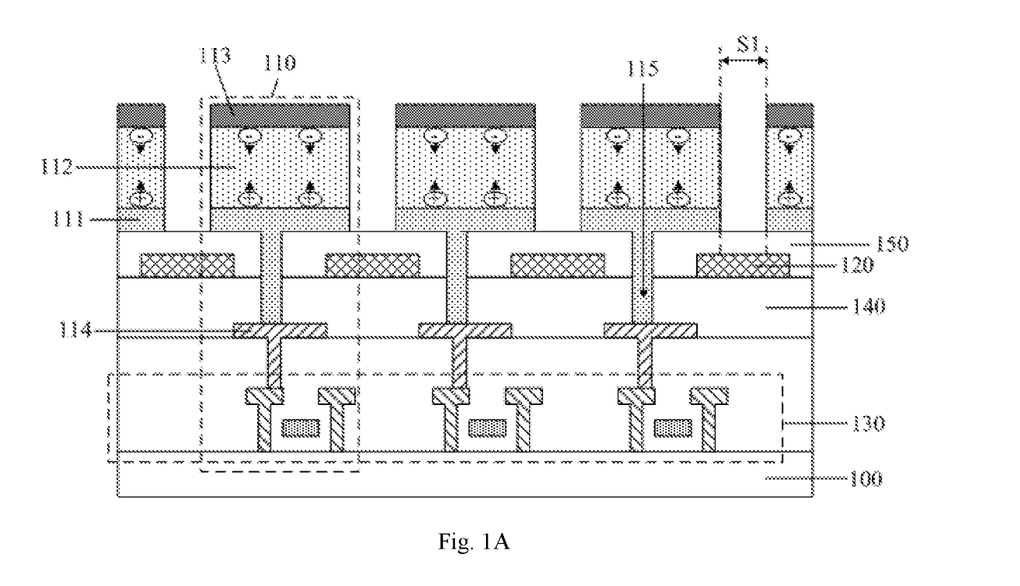
FIG. 1A illustrates a schematic structural diagram of an array substrate provided by an embodiment of the present disclosure.
Figure 1B:
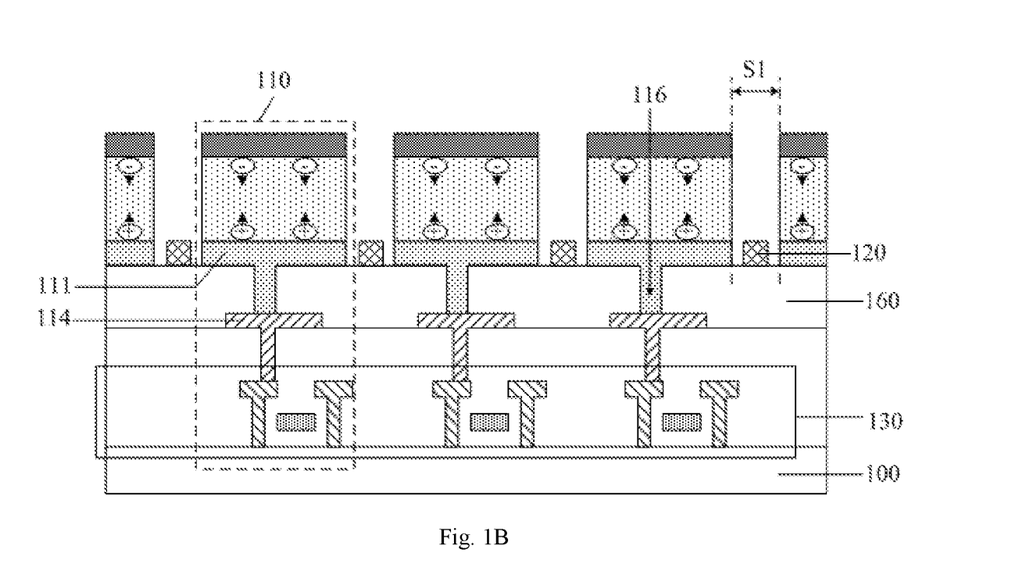
FIG. 1B illustrates a schematic structural diagram of an array substrate provided by an embodiment of the present disclosure.
Figure 1C:
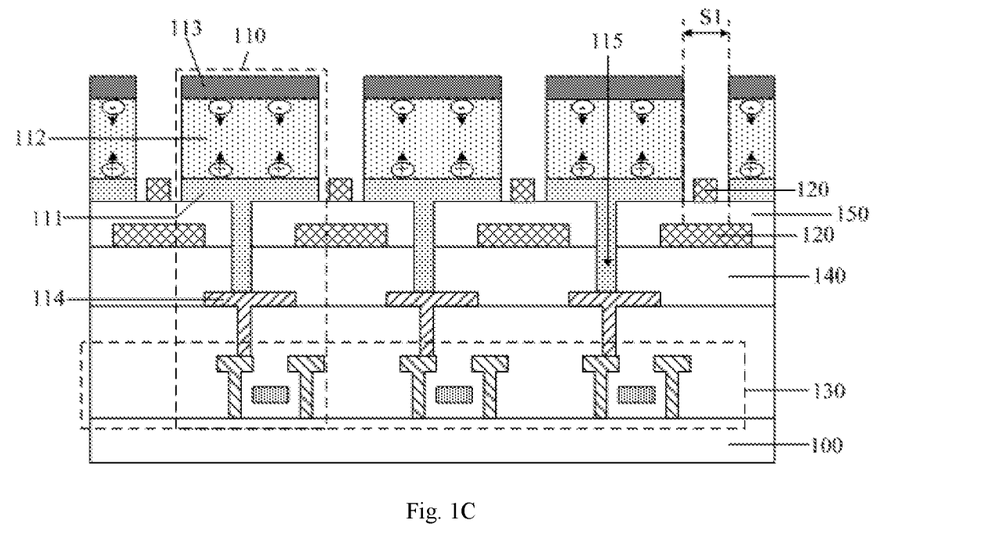
FIG. 1C illustrates a schematic structural diagram of an array substrate provided by an embodiment of the present disclosure.

An embodiment of the present disclosure provides an array substrate, as illustrated in FIGS. 1A-1C, including a substrate 100 and a plurality of pixels 110 located on a side of substrate 100, each of the pixels 110 includes an anode 111, the array substrate may further include a shielding layer 120 disposed to be insulated from each of the anodes 111, the shielding layer 120 is used to shield an electric field between two adjacent pixels 110.

In the above array substrate provided by the embodiment of the present disclosure, there is disposed a shielding layer insulated from each of the anodes and capable of shielding an electric field between two adjacent pixels, so that when a pixel emits light, an electric field between an anode in the pixel emitting light and an anode in an adjacent pixel can be shielded. Thus, it is possible to avoid a coupling voltage at the anode in the adjacent pixel caused by the anode in the pixel emitting light under the coupling effect between the two adjacent pixels, thereby eliminating the interference with the pixel light emission from the coupling effect between the anodes in the two adjacent pixels, and improving the display effect. For example, when a display panel of the prior art works normally, and one of two adjacent pixels emits light while the other does not emit light, the pixel emitting light causes the pixel not emitting light to be interfered by the electric field under the coupling effect between the adjacent pixels, and the display effect will be affect. But when a display panel formed by the array substrate provided by the embodiment of the present disclosure works normally, the coupling effect between the anodes in two adjacent pixels can be eliminated by disposing the shielding layer, thereby improving the display effect.

In a specific implementation, in the above array substrate provided by the embodiment of the present disclosure, as illustrated in FIG. 1A, the shielding layer 120 may be located on a side of each of the anodes 111 facing the substrate 100, and an orthographic projection of the shielding layer 120 on the substrate 100 at least partially overlaps an orthographic projection of a gap S1 between respective adjacent pixels 110 on the substrate 100. Thus, during the fabrication of a high-resolution display panel, especially in a process of forming a small-sized or micro-sized high-resolution display panel, there are less requirements for the process of forming the array substrate, and the process difficulty can be reduced. In the embodiment of the present disclosure, the orthographic projection of the gap between respective adjacent pixels on the substrate may be within the orthographic projection of the shielding layer on the substrate. In another embodiment of the present disclosure, the orthographic projection of the shielding layer on the substrate may also be within the orthographic projection of the gap between respective adjacent pixels on the substrate.

In the embodiment of the present disclosure, as illustrated in FIG. 1B, the shielding layer 120 may also be disposed in the same layer as each of the anodes 111 and located at the gap S1 between the respective pixels 110. This can cause the shielding layer 120 to directly shield the electric field generated between the anodes 111 in two adjacent pixels 110, thereby improving the shielding effect of the shielding layer 120, and reducing the overall thickness of the array substrate.

In order to further improve the effect of shielding the electric field by the shielding layer, in a specific implementation, in the above array substrate provided by the embodiment of the present disclosure, as illustrated in FIG. 1C, the array substrate may include a shielding layer 120 having a first portion and a second portion. In which, the first portion of the shielding layer 120 may be located on a side of each of the anodes 111 facing the substrate 100, and an orthographic projection of the shielding layer 120 on the substrate 100 at least partially overlaps an orthographic projection of a gap S1 between respective adjacent pixels 110 on the substrate 100, the second portion of the shielding layer 120 may be disposed in the same layer as each of the anodes 111 and located at the gap S1 between the respective pixels 110.

In a specific implementation, in the above array substrate provided by the embodiment of the present disclosure, as illustrated in FIGS. 1A-1C, the array substrate further includes a light emitting function layer 112 and a cathode 113 disposed in a stack on a side of the anode 111 away from the substrate 100. In which, the light emitting function layer specifically may include a hole injection layer, a hole transporting layer, a light emitting layer, an electron transporting layer, and an electron injection layer which are disposed in a stack on the anode. In addition, the material of the light emitting layer may be an organic light emitting material. In which, the light emitting layer may be a white light emitting layer, and alternatively a monochromatic light emitting layer, which is not limited herein. In addition, as illustrated in FIGS. 1A-1C, when the pixel emits light, generally the anode generates holes, the cathode generates electrons, and the holes and electrons are combined to emit light in the light emitting layer.

In a specific implementation, in the above array substrate provided by the embodiment of the present disclosure, the material of the anode may be a transparent single-layer conductive thin film, such as ITO, IZO, carbon nanotube, graphene, nano gold, or nano silver. Alternatively, the material of the anode may be a transparent composite conductive thin film, such as stacked ITO, Ag, and ITO, stacked ITO, Al, and ITO, stacked Al and TiN, or stacked Al and MoOx, which is not limited herein.

In a specific implementation, in the above array substrate provided by the embodiment of the present disclosure, the substrate may be a glass substrate or a flexible substrate. Alternatively, the substrate may also be a silicon substrate. In addition, the silicon substrate may also be a polycrystalline silicon substrate, an amorphous silicon substrate, or a monocrystalline silicon substrate. As illustrated in FIGS. 1A-1C, the substrate 100 further includes a pixel driving circuit 130 located in each of the pixels 110. The specific structure and fabrication process of the pixel driving circuit in each substrate described above are substantially the same as those in the prior art, and can be understood by those skilled in the art, so the details are not described herein. Since the display panel formed by the silicon substrate has the characteristics of a small volume and a high resolution, in the silicon-based display panel, the pixel size is usually about 5 micrometers (um), and the distance between the pixels is about 1 um or less. The distance between the pixels is small, the solution provided by this embodiment can effectively reduce the mutual interference between the pixels and improve the display effect.

The structures of the above array substrates provided by the embodiments of the present disclosure will be described below, respectively.

Embodiment 1

In the array substrate provided by the embodiment of the present disclosure as illustrated in FIGS. 1A-1C, the description is made through an example in which the shielding layer 120 is located on a side of each of the anodes 111 facing the substrate 100, and an orthographic projection of the shielding layer 120 on the substrate 100 at least partially overlaps an orthographic projection of a gap between the respective adjacent pixels 110 on the substrate 100.

In a specific implementation, in the array substrate provided by the embodiment of the present disclosure, a material of the shielding layer may be a conductive material. In addition, the shielding layer is grounded to have a zero potential, so as to form an electric field with the anode. In which, the conductive material may be a transparent conductive material, such as an indium tin oxide (ITO) material, an indium zinc oxide (IZO) material, a carbon nanotube, graphene, nano gold, or nano silver. Alternatively, the conductive material may also be a metallic material, such as one of gold, silver, aluminum, copper, and molybdenum, or a combination thereof. It should be understood that in practical applications, the material of the shielding layer may also be any other material having the function of shielding an electric field between two adjacent pixels, which is not limited herein.

In a specific implementation, in the array substrate provided by the embodiment of the present disclosure, as illustrated in FIG. 1A, the array substrate may further include a top electrode 114 located in each of the pixels 110 on a side of the shielding layer 120 facing the substrate 100, a first insulation layer 140 located between the top electrode 114 and the shielding layer 120, and a second insulation layer 150 located between the shielding layer 120 and each of the anodes 111. In addition, each of the anodes 111 is electrically connected to corresponding top electrode 114 through a first via 115 running through the first insulation layer 140 and the second insulation layer 150. In which, an orthographic projection of each of the first vias 115 on the substrate 100 is within an orthographic projection of corresponding top electrode 114 on the substrate 100, and does not overlap the orthographic projection of the shielding layer 120 on the substrate 100. As the disposing of the shielding layer 120, in practical applications, the anode 111 and the top electrode 114 in each of the pixels 110 need to be electrically connected to each other to transmit an electric signal of light emission. Thus, in order to prevent the shielding layer 120 from being electrically connected to the anode 111 and the top electrode 114, the first insulation layer 140 is disposed to achieve an insulation effect between the top electrode 114 and the shielding layer 120, and the second insulation layer 150 is disposed to achieve an insulation effect between each of the anodes 111 and the shielding layer 120. In addition, in order that the top electrodes 114 are electrically connected to the respective anodes 111, the first vias 115 one-to-one corresponding to the top electrodes 114 are disposed so that anode 111 is electrically connected to corresponding top electrode 114 through corresponding first via 115. Moreover, in order to avoid the influence from the shielding layer 120 on the electric signal transmitted between the anode 111 and the top electrode 114, the first via 115 does not overlap the shielding layer 120 in a direction perpendicular to the substrate 100.

In a specific implementation, in the array substrate provided by the embodiment of the present disclosure, as illustrated in FIG. 1A, the orthographic projection of the shielding layer 120 on the substrate 100 covers an orthographic projection of an edge of each of the anodes 111 on the substrate 100.

Figure 2:
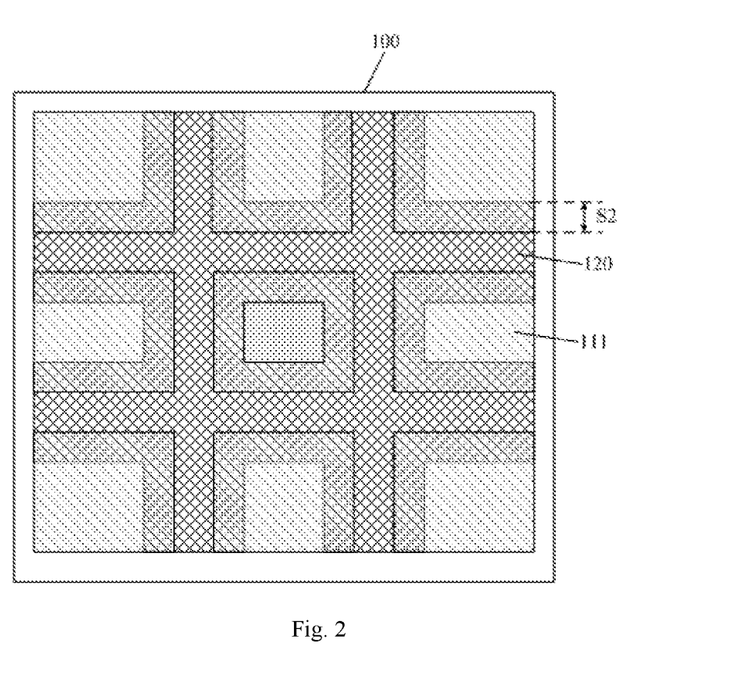
FIG. 2 illustrates a top view of an array substrate as illustrated in FIG. 1A.

There is a first coupling capacitor between the shielding layer 120 and each of the anodes 111, there is a second coupling capacitor between two adjacent anodes 111, and a capacitance value of the first coupling capacitor corresponding to each of the anodes 111 is not less than a capacitance value of corresponding second coupling capacitor. In which, as illustrated in FIG. 2, the orthographic projection of the shielding layer 120 on the substrate 100 covers the orthographic projection of the edge of each of the anodes 111 on the substrate 100, so that the shielding layer 120 and the edge of each of the anodes 111 have a facing region S2 therebetween in a direction perpendicular to the substrate 100. In the facing region S2, the first coupling capacitor is formed between the shielding layer 120 and the anode 111. In addition, the facing region S2 between the shielding layer 120 and the edge of each of the anodes 111 in the direction perpendicular to the substrate 100 has a facing area. Moreover, the cross-sections of two adjacent anodes 111 in the direction perpendicular to the substrate 100 also have a facing region therebetween, in the facing region, the second coupling capacitor is formed between the two adjacent anodes. The facing region between the two adjacent anodes 111 in the direction perpendicular to the substrate 100 also has a facing area.

Specifically, where the capacitance value of the first coupling capacitor corresponding to each of the anodes is larger than the capacitance value of corresponding second coupling capacitor, since the shielding layer is directly grounded, when a certain pixel emits light and an anode therein has a voltage, the anode in the pixel emitting light preferentially generates an electric field through the coupling capacitor having the larger capacitance value. That is, the anode in the pixel emitting light preferentially generates an electric field through the first coupling capacitor rather than the second coupling capacitor, thereby preventing the anode in the pixel emitting light from interfering with the light emission of other adjacent pixels under the coupling effect, and improving the display effect.

When the capacitance value of the first coupling capacitor corresponding to each of the anodes is equal to the capacitance value of corresponding second coupling capacitor, since a light emitting function layer for light emission is generally disposed on the anode, the load on the anode is large, and the shielding layer is directly grounded without any additional load. Thus, when a certain pixel emits light and an anode therein has a voltage, the anode in the pixel emitting light preferentially generates an electric field through the first coupling capacitor rather than the second coupling capacitor, thereby preventing the anode in the pixel emitting light from interfering with the light emission of other adjacent pixels under the coupling effect, and improving the display effect.

The capacitance value $C_0$ of the capacitor satisfies a formula:

$$C_0 = \frac{\varepsilon S}{4\pi k d},$$

wherein $\varepsilon$ is a dielectric constant of a dielectric between two electrodes of a capacitor, S is a facing area between the two electrodes of the capacitor, k is an electrostatic force constant, and d is a distance between the two electrodes of the capacitor. As can be seen from the formula that the capacitance value $C_0$ satisfies, the capacitance value $C_0$ of the capacitor can be adjusted by adjusting the facing area or the distance between the two electrodes of the capacitor. In order that the capacitance value of the first coupling capacitor corresponding to each of the anodes is not less than the capacitance value of corresponding second coupling capacitor, in a specific implementation, in the array substrate provided by the embodiment of the present disclosure, as for each of the anodes, the facing area between the shielding layer and the edge of each of the anodes may be equal to the facing area between the anode and an adjacent anode, and the distance between the shielding layer and the anode may be not larger than the distance between the anode and the adjacent anode.

Alternatively, as for each of the anodes, the distance between the shielding layer and each of the anodes may be equal to the distance between the anode and an adjacent anode, and the facing area between the shielding layer and the edge of each of the anodes may be not less than the facing area between the anode and the adjacent anode. Thus, it is possible to firstly determine one variable (the facing area or distance between the two electrodes of the capacitor), and then adjust the other variable (the distance or facing area between the two electrodes of the capacitor), so as to quickly achieve the effect that the capacitance value of the first coupling capacitor corresponding to each of the anodes is not less than the capacitance value of corresponding second coupling capacitor.

It should be understood that, the effect that the capacitance value of the first coupling capacitor corresponding to each of the anodes is not less than the capacitance value of corresponding second coupling capacitor can also be achieved by simultaneously adjusting the distance between the shielding layer and each of the anodes and the distance between the anode and the adjacent anode, and adjusting the facing area between the shielding layer and the edge of each of the anodes and the facing area between the anode and the adjacent anode, which is not limited herein.

In a specific implementation, in the array substrate provided by the embodiment of the present disclosure, the material of the first insulation layer and the material of the second insulation layer may be an inorganic material, such as $SiN_x$, $SiO_2$, or the like. Alternatively, the material of the first insulation layer and the material of the second insulation layer may also be an organic material, such as an organic resin material or the like, which is not limited herein.

In a specific implementation, in the array substrate provided by the embodiment of the present disclosure, the top electrode is electrically connected to a pixel driving circuit in the pixel in which the top electrode is located, so that the pixel driving circuit inputs current to the anode through the top electrode, thereby driving the light emitting layer to emit light. In addition, the material of the top electrode may be a conductive material.

In a specific implementation, in the array substrate provided by the embodiment of the present disclosure, the shielding layer may be a grid-like integrated structure. Thus, the shielding layer may be formed in a one patterning process, thereby simplifying the fabrication process and reducing the production cost. It should be understood that the shielding layer may also be a plurality of strip-like structures electrically connected to each other, which is not limited herein.

In the embodiment of the present disclosure, in order to further shield the electric field between the two adjacent pixels, the array substrate may further include a second portion of the shielding layer disposed in the same layer as each of the anodes and located at a gap between the respective pixels. As a result, the shielding layer has a first portion and a second portion, as illustrated in FIG. 1C, wherein the first portion of the shielding layer 120 is located on a side of each of the anodes 111 facing the substrate 100, the orthographic projection of the shielding layer 120 on the substrate 100 at least partially overlaps the orthographic projection of the gap S1 between the respective adjacent pixels 110 on the substrate 100, and the second portion of the shielding layer 120 is disposed in the same layer as each of the anodes 111 and located at the gap S1 between the respective pixels 110. For the other film layers in the array substrate as illustrated in FIG. 1C, please refer to the above embodiment of FIG. 1A, and they are not described herein.

Embodiment 2

In the array substrate provided by the embodiment of the present disclosure as illustrated in FIG. 1B, the description is made through an example in which the shielding layer 120 is disposed in the same layer as each of the anodes 111 and located at the gap S1 between the respective pixels 110.

In a specific implementation, in the array substrate provided by the embodiment of the present disclosure, a material of the shielding layer may be a conductive material, and the shielding layer is grounded to have a zero potential. In which, the conductive material may be a transparent conductive material, such as an indium tin oxide (ITO) material, an indium zinc oxide (IZO) material, a carbon nanotube, graphene, nano gold, or nano silver. Alternatively, the conductive material may also be a metallic material, such as one of gold, silver, aluminum, copper, and molybdenum, or a combination thereof. It should be understood that in practical applications, the material of the shielding layer may be any other material having the function of shielding an electric field between two adjacent pixels, which is not limited herein.

In a specific implementation, in the array substrate provided by the embodiment of the present disclosure, as illustrated in FIG. 1B, the shielding layer 120 may be disposed in the same layer and the same thickness as each of the anodes 111 and located at the gap S1 between the respective pixels 110. Thus, the electric field between the two adjacent anodes 111 can be completely shielded by the grounded shielding layer 120, so that the two adjacent anodes can be isolated from each other to avoid an electric field from being formed therebetween under the coupling effect, thereby preventing the anode in the pixel emitting light from interfering with the light emission of other adjacent pixels under the coupling effect, and improving the display effect.

In a specific implementation, in the array substrate provided by the embodiment of the present disclosure, the shielding layer may be a grid-like integrated structure. Thus, the shielding layer may be formed in a one patterning process, thereby simplifying the fabrication process and reducing the production cost. It should be understood that the shielding layer may also be a plurality of strip-like structures electrically connected to each other, which is not limited herein.

Further, in a specific implementation, in the array substrate provided by the embodiment of the present disclosure, the shielding layer and each of the anodes may be made of the same material. Thus, when the array substrate is to be fabricated, the shielding layer and each of the anodes can be formed in a one patterning process just by changing the original patterned graphics when forming each of the anodes, without any additional shielding layer fabrication process, thereby simplifying the fabrication process and saving the production cost.

In a specific implementation, in the array substrate provided by the embodiment of the present disclosure, as illustrated in FIG. 1B, the array substrate further includes a top electrode 114 located in each of the pixels 110 on a side of the shielding layer 120 facing the substrate 100, and a third insulation layer 160 located between the shielding layer 120 and the top electrode 114.

Each of the anodes 111 is electrically connected to corresponding top electrode 114 through a second via 116 running through the third insulation layer 160. In which, an orthographic projection of each of the second vias 116 on the substrate 100 is within an orthographic projection of corresponding top electrode 114 on the substrate 100, and does not overlap the orthographic projection of the shielding layer 120 on the substrate 100. As the disposing of the shielding layer 120, in practical applications, the anode 111 and the top electrode 114 in each of the pixels 110 need to be electrically connected to each other to transmit an electric signal of light emission. Thus, in order to prevent the shielding layer 120 from being electrically connected to the anode 111 and the top electrode 114, the third insulation layer 160 is disposed to achieve an insulation effect between the top electrode 114 and the shielding layer 120. In addition, in order that the top electrodes 114 are electrically connected to the respective anodes 111, the second vias 116 one-to-one corresponding to the top electrodes 114 are disposed so that anode 111 is electrically connected to corresponding top electrode 114 through corresponding second via 116. Moreover, in order to avoid the influence from the shielding layer 120 on the electric signal transmitted between the anode 111 and the top electrode 114, the second via 116 does not overlap the shielding layer 120 in a direction perpendicular to the substrate 100.

In a specific implementation, in the array substrate provided by the embodiment of the present disclosure, a material of the third insulation layer may be an inorganic material, such as SiNx, SiO2, or the like. Alternatively, the material of the third insulation layer may be an organic material, such as an organic resin material or the like, which is not limited herein.

In a specific implementation, in the array substrate provided by the embodiment of the present disclosure, the top electrode is electrically connected to a pixel driving circuit in the pixel in which the top electrode is located, so that the pixel driving circuit inputs current to the anode through the top electrode, thereby driving the light emitting layer to emit light. In addition, the material of the top electrode may be a conductive material.

In a specific implementation, in the array substrate provided by the embodiment of the present disclosure, the array substrate may further include a fourth insulation layer located on a side of the shielding layer away from the substrate, and an orthographic projection of the fourth insulation layer on the substrate covers the orthographic projection of the shielding layer on the substrate, and does not overlap the orthographic projection of each of the anodes on the substrate. In this way, the shielding layer and each of the anodes disposed in the same layer have a good insulation effect therebetween, which avoids the fourth insulation layer from affecting the input of holes from the anode to the light emitting function layer.

Figure 3:
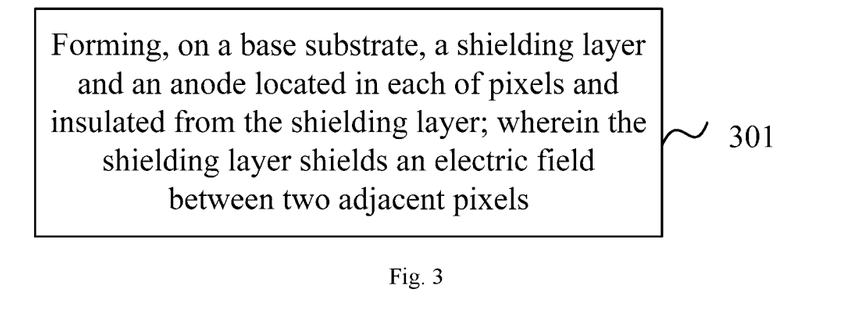
FIG. 3 illustrates a flowchart of a method for fabricating provided by an embodiment of the present disclosure.

Based on the same disclosure conception, the embodiments of the present disclosure further provide a method for fabricating any of the array substrates provided by the embodiments of the present disclosure. As illustrated in FIG. 3, the method may include the steps of:

S301: forming, on a substrate, a shielding layer and an anode located in each of the pixels and insulated from the shielding layer, wherein the shielding layer shields an electric field between two adjacent pixels.

In a specific implementation, after forming, on a substrate, a shielding layer and an anode located in each of the pixels and insulated from the shielding layer, the method provided by the embodiment of the present disclosure may further include sequentially forming a light emitting function layer and a cathode on the substrate where the anode is formed.

In the prepared array substrate, the shielding layer is located on a side of each of the anodes facing the substrate, and an orthographic projection of the shielding layer on the substrate at least partially overlaps an orthographic projection of a gap between the respective adjacent pixels on the substrate. In a specific implementation, before forming, on a substrate, a shielding layer and an anode located in each of the pixels and insulated from the shielding layer, the method provided by the embodiment of the present disclosure may further include forming a top electrode located in each of the pixels on the substrate, forming a first insulation layer on the substrate where the top electrode is formed, forming a shielding layer may specifically include forming a shielding layer on the substrate where the first insulation layer is formed, after forming the shielding layer and before forming the anode located in each of the pixels and insulated from the shielding layer, the method may further include forming, on the substrate where the shielding layer is formed, a second insulation layer and respective first vias running through the first insulation layer and the second insulation layer, wherein an orthographic projection of each of the first vias on the substrate is within an orthographic projection of corresponding top electrode on the substrate, and does not overlap an orthographic projection of the shielding layer on the substrate; forming an anode located in each of the pixels and insulated from the shielding layer may specifically include forming an anode in each of the pixels of the substrate where the first vias are formed, so that the anode is electrically connected to corresponding top electrode through corresponding first via. In addition, when forming an anode in each of the pixels of the substrate where the first vias are formed, the method further includes forming a second shielding layer located at a gap between the respective anodes. For the array substrate fabricated in this method, please refer to the above embodiment, and the repeated content is omitted herein.

In the prepared array substrate, the shielding layer is disposed in the same layer as each of the anodes and located at a gap between the respective pixels. In a specific implementation, before forming, on a substrate, a shielding layer and an anode located in each of the pixels and insulated from the shielding layer, the method provided by the embodiment of the present disclosure may further include forming a top electrode located in each of the pixels on the substrate, forming, on the substrate where the top electrode is formed, a third insulation layer and respective second vias running through the third insulation layer and located in each of the pixels, wherein an orthographic projection of each of the second vias on the substrate is within an orthographic projection of corresponding top electrode on the substrate, forming, on a substrate, a shielding layer and an anode located in each of the pixels and insulated from the shielding layer may specifically include forming, on the substrate where the third insulation layer is formed, a shielding layer and an anode located in each of the pixels and insulated from the shielding layer, so that each of the anodes is electrically connected to corresponding top electrode through corresponding second via, wherein the orthographic projection of each of the second vias on the substrate does not overlap the orthographic projection of the shielding layer on the substrate. For the array substrate fabricated in this method, please refer to the above embodiment, and the repeated content is omitted herein.

Embodiment 3

Figure 4A:
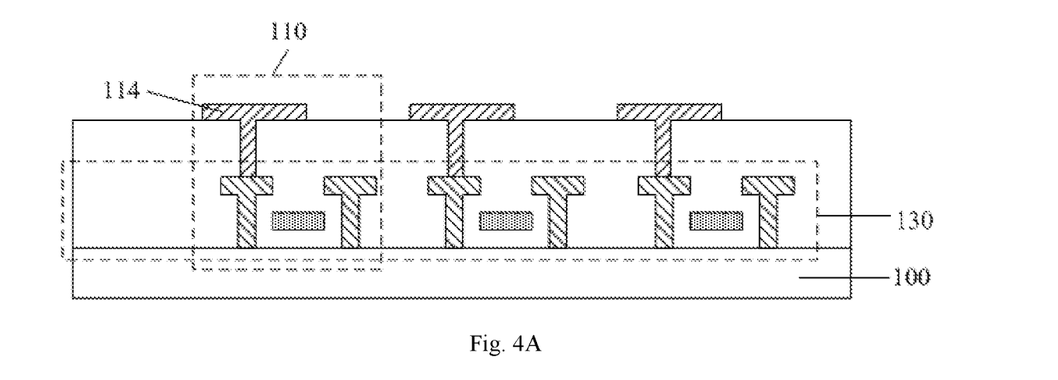
FIGS. 4A-4E respectively illustrate schematic cross-sectional structural diagrams after each step according to an embodiment of the present disclosure.

Specifically, the method for fabricating the array substrate as illustrated in FIG. 1A where the shielding layer 120 is located on a side of each of the anodes 111 facing the substrate 100 includes the step of forming a top electrode 114 located in each of the pixels 110 on the substrate 100, as illustrated in FIG. 4A. Specifically, the top electrode 114 located in each of the pixels 110 is formed on the substrate 100 in a one patterning process. In addition, during practical fabrications, the substrate 100 has been formed in advance with a pixel driving circuit 130 located in each of the pixels 110, and the formed top electrode 114 is electrically connected to corresponding pixel driving circuit 130.

Figure 4B:
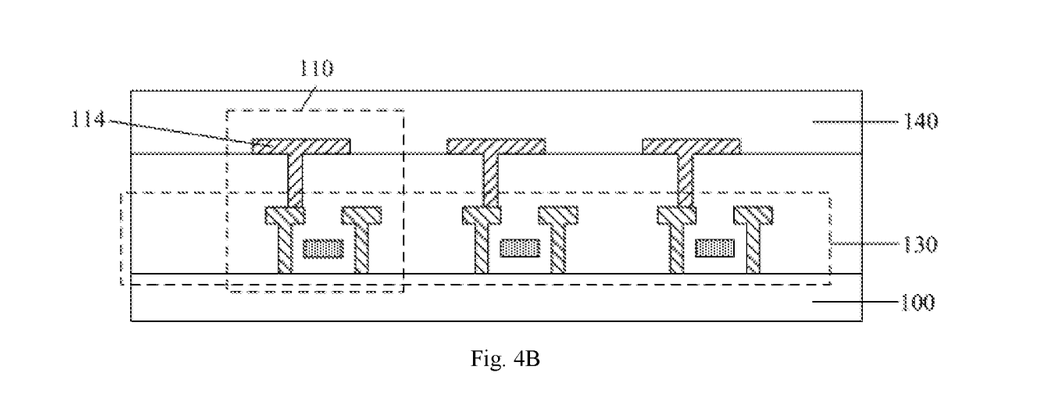

The method according to this embodiment further includes forming a first insulation layer 140 on the substrate 100 where the top electrode 114 is formed, as illustrated in FIG. 4B. Specifically, the first insulation layer 140 is formed in a one patterning process on the substrate 100 where the top electrode 114 is formed.

Figure 4C:
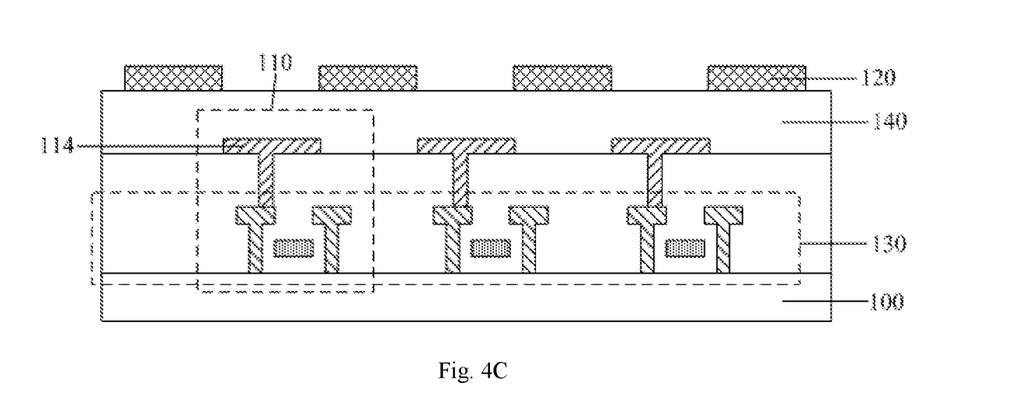

The method according to this embodiment further includes forming a shielding layer 120 on the substrate 100 where the first insulation layer 140 is formed, as illustrated in FIG. 4C. Specifically, the shielding layer 120 is formed in a one patterning process on the substrate 100 where the first insulation layer 140 is formed. In which, a material of the shielding layer 120 may be a conductive material, and the shielding layer 120 is grounded. In which, the conductive material may be a transparent conductive material, such as an indium tin oxide (ITO) material, an indium zinc oxide (IZO) material, a carbon nanotube, graphene, nano gold, or nano silver. Alternatively, the conductive material may also be a metallic material, such as one of gold, silver, aluminum, copper, and molybdenum, or a combination thereof. In addition, a film thickness of the formed shielding layer 120, i.e., a thickness in the direction perpendicular to the substrate 100 is about 5 to 100 nanometers (nm).

Figure 4D:
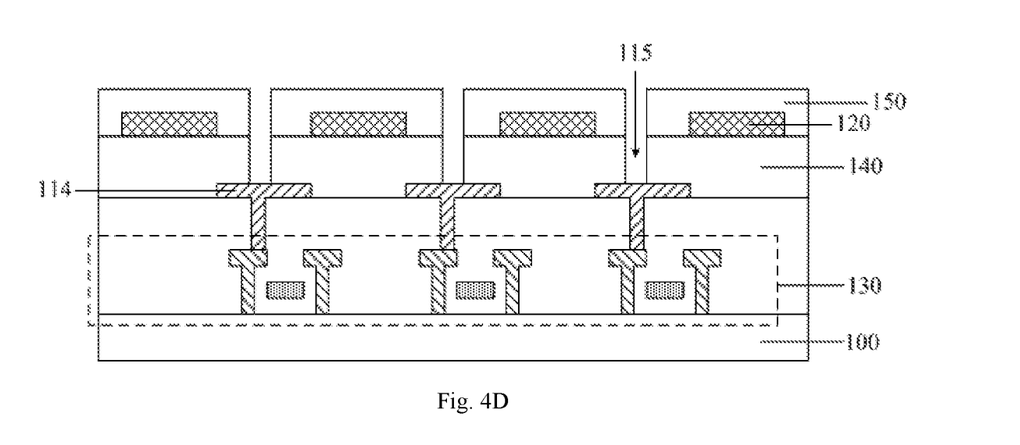

The method according to this embodiment further includes forming, on the substrate 100 where the shielding layer 120 is formed, a second insulation layer 150 and respective first vias 115 running through the first insulation layer 140 and the second insulation layer 150, as illustrated in FIG. 4D. In which, an orthographic projection of each of the first vias 115 on the substrate 100 is within an orthographic projection of corresponding top electrode 114 on the substrate 100, and does not overlap the orthographic projection of the shielding layer 120 on the substrate 100. Specifically, the second insulation layer 150 and the respective first vias 115 running through the first insulation layer 140 and the second insulation layer 150 are formed in a one patterning process on the substrate 100 where the shielding layer 120 is formed.

Figure 4E:
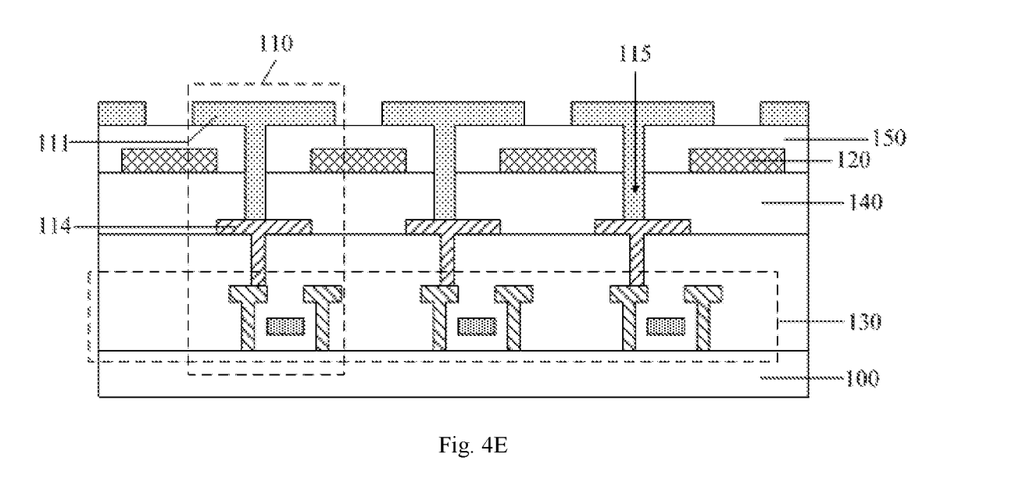

The method according to this embodiment further includes forming an anode 111 in each of the pixels 110 of the substrate 100 where the first vias 115 are formed, so that each of the anodes 111 is electrically connected to corresponding top electrode 114 through corresponding first via 115, as illustrated in FIG. 4E. Specifically, the anode 111 is formed in a one patterning process in each of the pixels 110 of the substrate 100 where the first vias 115 are formed. The method may further include forming a second shielding layer at a gap between the respective anodes.

The method according to this embodiment further includes forming a light emitting function layer 112 and a cathode 113, as illustrated in FIG. 1A.

Embodiment 4

Figure 5A:
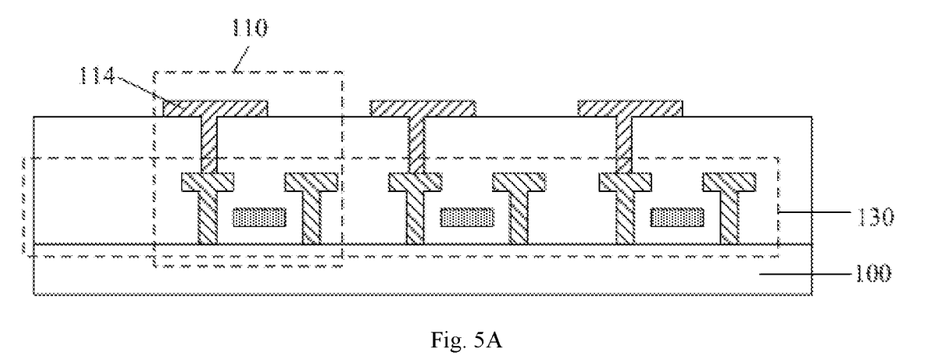
FIGS. 5A-5C respectively illustrate schematic cross-sectional structural diagrams after each step according to another embodiment of the present disclosure.

Specifically, the method for fabricating the array substrate as illustrated in FIG. 1B, in which the shielding layer 120 is disposed in the same layer as each of the anodes 111, includes forming a top electrode 114 located in each of the pixels 110 on the substrate 100, as illustrated in FIG. 5A. Specifically, the top electrode 114 located in each of the pixels 110 is formed in a one patterning process on the substrate 100. In addition, during practical preparations, the substrate 100 has been formed in advance with a pixel driving circuit 130 located in each of the pixels 110, and the formed top electrode 114 is electrically connected to corresponding pixel driving circuit 130.

Figure 5B:
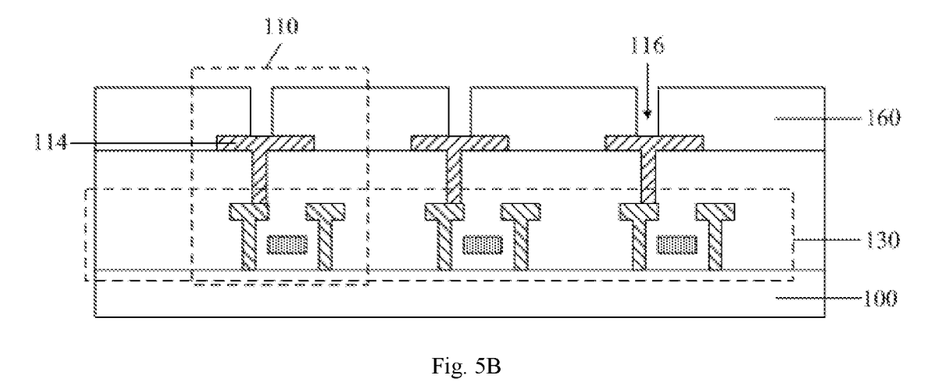

The method according to this embodiment further includes forming, on the substrate 100 where the top electrode 114 is formed, a third insulation layer 160, and a second via 116 located in each of the pixels 100 and running through the third insulation layer 160, as illustrated in FIG. 5B. In which, an orthographic projection of each of the second vias 116 on the substrate 100 is within an orthographic projection of corresponding top electrode 114 on the substrate 100. Specifically, the third insulation layer 160 and the second via 116 located in each of the pixels 100 and running through the third insulation layer 160 are formed in a one patterning process on the substrate 100 where the top electrode 114 is formed.

Figure 5C:
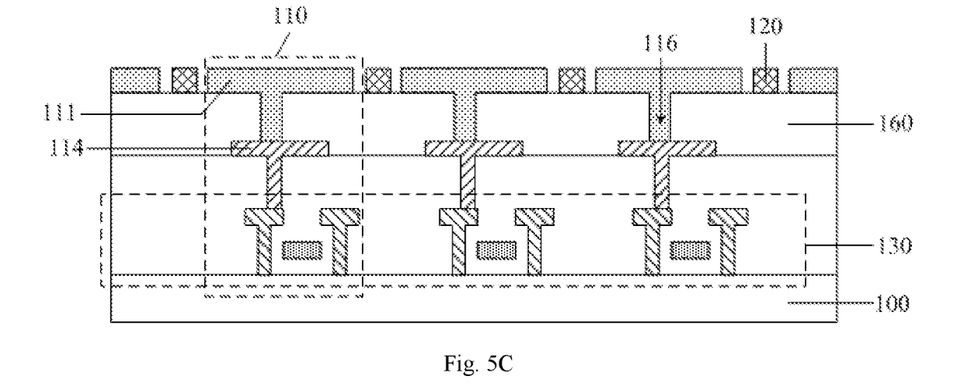

The method according to this embodiment further includes forming, on the substrate 100 where the third insulation layer 160 is formed, a shielding layer 120 and an anode 111 located in each of the pixels 110 and insulated from the shielding layer 120, so that each of the anodes 111 is electrically connected to corresponding top electrode 114 through corresponding second via 116, as illustrated in FIG. 5C. In which, an orthographic projection of each of the second vias 116 on the substrate 100 does not overlap the orthographic projection of the shielding layer 120 on the substrate 100. Specifically, the shielding layer 120 and the anode 111 located in each of the pixels 110 and insulated from the shielding layer 120 are formed in a one patterning process on the substrate 100 where the third insulation layer 160 is formed. Thus, the shielding layer 120 and the anode 111 are of the same layer, material, and thickness. It should be understood that the shielding layer 120 and the anode 111 located in each of the pixels 110 and insulated from the shielding layer 120 may be formed in two patterning processes respectively, so that the shielding layer 120 is in the same layer and the same thickness as the anode 111. In which, a material of the shielding layer may be a conductive material, and the shielding layer is grounded. In which, the conductive material may be a transparent conductive material, such as an indium tin oxide (ITO) material, an indium zinc oxide (IZO) material, a carbon nanotube, graphene, nano gold, or nano silver. Alternatively, the conductive material may also be a metallic material, such as one of gold, silver, aluminum, copper, and molybdenum, or a combination thereof. It should be understood that in practical applications, the material of the shielding layer may be any other material having the function of shielding an electric field between two adjacent pixels, which is not limited herein.

The method according to this embodiment further includes forming a light emitting function layer 112 and a cathode 113, as illustrated in FIG. 1B. During practical preparations, after this step and before forming a light emitting function layer and a cathode, the method may further include forming a fourth insulation layer in a one patterning process on the substrate where the shielding layer and the anode are formed. In which, an orthographic projection of the fourth insulation layer on the substrate covers the orthographic projection of the shielding layer on the substrate, and does not overlap the orthographic projection of each of the anodes on the substrate.

It should be noted that in the method provided by the embodiment of the present disclosure, the patterning process may include a photolithography process. Alternatively, the patterning process may include a photolithography process and etching steps. Additionally, it may include other processes for forming various components with predetermined shapes, such as printing, inkjet, and the like. The photolithography process refers to a process of forming a component using a photoresist, a mask plate, an exposure machine, or the like, including procedures such as film formation, exposure, development, and thermal baking. In a specific implementation, corresponding patterning process may be selected according to the structure formed in the present disclosure.

Based on the same disclosure conception, the embodiments of the present disclosure further provide a display panel, including any array substrate provided by the embodiments of the present disclosure. The principle of the display panel is similar to that of the foregoing array substrate. Therefore, the implementation of the display panel may refer to the foregoing embodiment of the array substrate, and the repeated content is not repeated herein. In addition, the display panel may be an Organic Light-Emitting Display (OLED) panel with a large size, a medium size, a small size, or a micro size.

In a specific implementation, the display panel provided by the embodiment of the present disclosure may be organic light-emitting display panel with a high-resolution.

In a specific implementation, the display panel provided by the embodiment of the present disclosure may be applied in devices such as a head-mounted video player, a head-mounted home theater, a head-mounted virtual reality simulator, a head-mounted game console, a pilot helmet system, an individual combat system, an infrared night vision device, a head-mounted medical diagnostic system, and the like.

Based on the same disclosure conception, the embodiments of the present disclosure further provide a display device, including the display panel provided by the embodiments of the present disclosure. The display device may be any product or component with a display function, such as a mobile phone, a tablet computer, a television, a monitor, a notebook computer, a head-mounted video player, a head-mounted home theater, a head-mounted virtual reality simulator, a head-mounted game console, a pilot helmet system, an individual combat system, an infrared night vision device, a head-mounted medical diagnostic system, and the like. Those skilled in the art should understand that other essential components of the display device are available, which are not described herein and should not be construed as limitations to the present disclosure. The implementation of the display device should refer to the embodiment of the above array substrate, and the repeated content is omitted.

In the array substrate, the method for fabricating the array substrate, the display panel and the display device provided by the embodiments of the present disclosure, disposing a shielding layer insulated from each of the anodes and capable of shielding an electric field between two adjacent pixels, so that when a pixel emits light, an electric field between an anode in the pixel emitting light and an anode in an adjacent pixel can be shielded. Thus, it is possible to avoid a coupling voltage at an anode in an adjacent pixel caused by the anode in the pixel emitting light under the coupling effect between the two adjacent pixels, thereby eliminating the interference with the pixel light emission from the coupling effect between the anodes of the two adjacent pixels, and improving the display effect.

Obviously, those skilled in the art can make various amendments and modifications to the present disclosure, without deviating from the spirit and scope of the present disclosure. Thus, if those amendments and modifications to the present disclosure fall within the scope of the claims and their equivalents of the present disclosure, the present disclosure is intended to include those amendments and modifications.

What is claimed is:

1. An array substrate, comprising a substrate and a plurality of pixels located on a side of the substrate, wherein each of the pixels comprises an anode, wherein the array substrate further comprises a shielding layer disposed to be insulated from each of the anodes, wherein the shielding layer is used to shield an electric field between two adjacent pixels, and wherein an orthographic projection of the shielding layer on the substrate at least partially overlaps an orthographic projection of a gap between the respective adjacent pixels on the substrate.

2. The array substrate according to claim 1, wherein the shielding layer is located on a side of each of the anodes facing the substrate.

3. The array substrate according to claim 2, wherein an orthographic projection of the gap between the adjacent pixels on the substrate is within the orthographic projection of the shielding layer on the substrate; and
wherein there is a first coupling capacitor between the shielding layer and each of the anodes, there is a second coupling capacitor between two adjacent anodes, and a capacitance value of the first coupling capacitor corresponding to each of the anodes is not less than a capacitance value of corresponding second coupling capacitor.

4. The array substrate according to claim 3, wherein, as for the anode, a facing area between the shielding layer and an edge of the anode in a direction perpendicular to the substrate is equal to a facing area between the anode and an adjacent anode, and wherein a distance between the shielding layer and the anode is not larger than a distance between the anode and the adjacent anode.

5. The array substrate according to claim 3, wherein, as for the anode, a distance between the shielding layer and the anode is equal to a distance between the anode and an adjacent anode, and wherein a facing area between the shielding layer and an edge of the anode in a direction perpendicular to the substrate is not less than a facing area between the anode and an adjacent anode.

6. The array substrate according to claim 2, further comprising a top electrode located in each of the pixels on a side of the shielding layer facing the substrate, a first insulation layer located between the top electrode and the shielding layer, and a second insulation layer located between the shielding layer and each of the anodes;
wherein each of the anodes is electrically connected to corresponding top electrode through a first via running through the first insulation layer and the second insulation layer, and wherein an orthographic projection of each of the first vias on the substrate is within an orthographic projection of corresponding top electrode on the substrate, and does not overlap the orthographic projection of the shielding layer on the substrate.

7. The array substrate according to claim 1, wherein the shielding layer is disposed in the same layer as each of the anodes and located at a gap between the respective pixels.

8. The array substrate according to claim 7, wherein the shielding layer is disposed in the same thickness as each of the anodes.

9. The array substrate according to claim 7, further comprising a top electrode located in each of the pixels on a side of the shielding layer facing the substrate, and a third insulation layer located between the shielding layer and the top electrode;
   wherein each of the anodes is electrically connected to corresponding top electrode through a second via running through the third insulation layer, and wherein an orthographic projection of each of the second vias on the substrate is within an orthographic projection of corresponding top electrode on the substrate, and does not overlap the orthographic projection of the shielding layer on the substrate.

10. The array substrate according to claim 1, wherein the shielding layer has a first portion and a second portion, wherein the first portion is located on a side of each of the anodes facing the substrate, and wherein a second portion is disposed in the same layer as each of the anodes and located at a gap between the respective pixels.

11. The array substrate according to claim 1, wherein a material of the shielding layer comprises a conductive material, and wherein the shielding layer is grounded.

12. The array substrate according to claim 11, wherein the conductive material comprises a metallic material.

13. A display panel comprising the array substrate according to claim 1.

14. A display device comprising the display panel according to claim 13.

15. A method for fabricating an array substrate, the method comprising:
   forming, on a substrate, a shielding layer and an anode located in each of a plurality of pixels on the substrate, the anode insulated from the shielding layer, wherein the shielding layer shields an electric field between two adjacent pixels, and wherein an orthographic projection of the shielding layer on the substrate at least partially overlaps an orthographic projection of a gap between the respective adjacent pixels on the substrate.

16. The method according to claim 15, wherein before forming, on a substrate, a shielding layer and an anode, the method further comprises:
   forming a top electrode located in each of the pixels on the substrate; and
   forming a first insulation layer on the substrate where the top electrode is formed;
   wherein forming a shielding layer comprises forming a shielding layer on the substrate where the first insulation layer is formed;
   wherein after forming a shielding layer and before forming an anode, the method further comprises forming, on the substrate where the shielding layer is formed, a second insulation layer and respective first vias running through the first insulation layer and the second insulation layer, wherein an orthographic projection of each of the first vias on the substrate is within an orthographic projection of corresponding top electrode on the substrate and does not overlap an orthographic projection of the shielding layer on the substrate; and
   wherein forming an anode comprises forming an anode in each of the pixels of the substrate where the first vias are formed, so that the anode is electrically connected to corresponding top electrode through corresponding first via.

17. The method according to claim 16, wherein a material of the formed shielding layer comprises a conductive material, and wherein the formed shielding layer is grounded.

18. The method according to claim 15, wherein before forming, on a substrate, a shielding layer and an anode, the method further comprises:
   forming a top electrode located in each of the pixels on the substrate;
   forming, on the substrate where the top electrode is formed, a third insulation layer and respective second vias running through the third insulation layer and located in each of the pixels, wherein an orthographic projection of each of the second vias on the substrate is within an orthographic projection of corresponding top electrode on the substrate; and
   wherein forming, on a substrate, a shielding layer and an anode comprises:
      forming, on the substrate where the third insulation layer is formed, a shielding layer and an anode located in each of the pixels and insulated from the shielding layer, so that each of the anodes is electrically connected to corresponding top electrode through corresponding second via, wherein an orthographic projection of each of the second vias on the substrate does not overlap an orthographic projection of the shielding layer on the substrate.

19. The method according to claim 15, wherein a material of the formed shielding layer comprises a conductive material, and wherein the formed shielding layer is grounded.

* * * * *

UNITED STATES PATENT AND TRADEMARK OFFICE
CERTIFICATE OF CORRECTION

PATENT NO. : 11,211,442 B2  
APPLICATION NO. : 16/087002  
DATED : December 28, 2021  
INVENTOR(S) : Wang et al.

Page 1 of 1

It is certified that error appears in the above-identified patent and that said Letters Patent is hereby corrected as shown below:

On the Title Page

In item (54), in Title, Line 1, delete "ARRAY SUBSTRATE, WITH SHIELDING" and insert therefor -- ARRAY SUBSTRATE WITH SHIELDING --.

In the Specification

Column 1, Line 1, delete "ARRAY SUBSTRATE, WITH SHIELDING" and insert therefor -- ARRAY SUBSTRATE WITH SHIELDING --.

Signed and Sealed this  
Fifth Day of April, 2022

Drew Hirshfeld  
*Performing the Functions and Duties of the*  
*Under Secretary of Commerce for Intellectual Property and*  
*Director of the United States Patent and Trademark Office*